United States Patent
Otaka et al.

(10) Patent No.: US 9,614,487 B2
(45) Date of Patent: Apr. 4, 2017

(54) WIRELESS COMMUNICATOIN METHOD AND APPARATUS FOR REDUCING RECEPTION ERROR BY PERFORMING AUTOMATIC GAIN CONTROL (AGC) BASED ON A COMPARISON BETWEEN THE RECEIVED SIGNAL AND A REFERENCE VALUE

(75) Inventors: Shoji Otaka, Yokohama (JP); Tsuyoshi Kogawa, Kawasaki (JP); Koji Ogura, Tokyo (JP); Toshiyuki Umeda, Inagi (JP); Takafumi Sakamoto, Machida (JP); Fumi Moritsuka, Ota (JP); Hiroaki Ishihara, Fuchu (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 260 days.

(21) Appl. No.: 13/415,922

(22) Filed: Mar. 9, 2012

(65) Prior Publication Data
US 2012/0231756 A1    Sep. 13, 2012

Related U.S. Application Data

(63) Continuation of application No. PCT/JP2009/004957, filed on Sep. 29, 2009.

(51) Int. Cl.
*H03G 3/30* (2006.01)
*H03G 3/20* (2006.01)

(52) U.S. Cl.
CPC ............. *H03G 3/3068* (2013.01); *H03G 3/20* (2013.01)

(58) Field of Classification Search
CPC .......... H03G 3/3068; H03G 3/20; H03G 3/32; H03G 1/02; H03G 3/001; H03G 3/301
(Continued)

(56) References Cited

U.S. PATENT DOCUMENTS 5,603,114 A * 2/1997 Tomita ................. 455/249.1
7,292,104 B1 * 11/2007 Liwinski ................ 330/283
(Continued)

FOREIGN PATENT DOCUMENTS

JP    04-167629    6/1992
JP    2005-020628    1/2005
(Continued)

OTHER PUBLICATIONS

International Preliminary Report on Patentability and Written Opinion issued Apr. 17, 2012 in PCT/JP2009/004957 (English translation only).

(Continued)

*Primary Examiner* — Devan Sandiford
(74) *Attorney, Agent, or Firm* — Oblon, McClelland, Maier & Neustadt, L.L.P.

(57) ABSTRACT

A receiving apparatus includes a variable gain unit to change between a first gain and a smaller second gain, and to amplify a received signal to obtain an amplified signal; a comparator to compare a power of the amplified signal with a reference value; and a controller to set a gain to the first gain while in a standby state, to reset a gain to a third gain between the first and second gains if in a standby state the power of the received signal is larger than the reference value, and then to set a gain to the first gain and return to the standby state if the power is equal to or lower than the reference value, or if not, to a fourth gain between the first and third gains.

7 Claims, 11 Drawing Sheets

(58) Field of Classification Search
USPC ........................................................ 455/341
See application file for complete search history.

(56) References Cited

U.S. PATENT DOCUMENTS

| | | | |
|---|---|---|---|
| 7,386,074 B1* | 6/2008 | Venkatesh et al. | 375/345 |
| 7,424,265 B2 | 9/2008 | Umeda et al. | |
| 7,840,181 B2 | 11/2010 | Umeda et al. | |
| 7,890,054 B2 | 2/2011 | Umeda et al. | |
| 2001/0024459 A1* | 9/2001 | Seo et al. | 372/29.021 |
| 2001/0031648 A1* | 10/2001 | Proctor et al. | 455/562 |
| 2002/0047744 A1* | 4/2002 | Ichihara | H03G 1/0088 |
| | | | 330/133 |
| 2003/0147481 A1* | 8/2003 | Chen | H03G 3/3052 |
| | | | 375/345 |
| 2003/0207674 A1* | 11/2003 | Hughes | H03G 3/3068 |
| | | | 455/234.1 |
| 2005/0077959 A1* | 4/2005 | Hika | 330/129 |
| 2005/0100119 A1* | 5/2005 | Husted | H03G 3/3068 |
| | | | 375/346 |
| 2008/0051050 A1* | 2/2008 | Kim et al. | 455/234.1 |
| 2012/0034875 A1* | 2/2012 | Moritsuka | H03F 3/195 |
| | | | 455/63.1 |
| 2012/0208482 A1* | 8/2012 | Kogawa | H04B 17/318 |
| | | | 455/253.2 |

FOREIGN PATENT DOCUMENTS

| | | |
|---|---|---|
| JP | 2005-117282 | 4/2005 |
| JP | 2005-184688 | 7/2005 |
| JP | 2006-311261 | 11/2006 |
| JP | 2006-311261 A * | 11/2006 |

OTHER PUBLICATIONS

Office Action issued Sep. 4, 2012 in Japanese Patent Application No. 2011-533940 (with English translation).

* cited by examiner

EDGE
DETECTION

WIRELESS COMMUNICATOIN METHOD AND APPARATUS FOR REDUCING RECEPTION ERROR BY PERFORMING AUTOMATIC GAIN CONTROL (AGC) BASED ON A COMPARISON BETWEEN THE RECEIVED SIGNAL AND A REFERENCE VALUE

CROSS-REFERENCE TO RELATED APPLICATION

This application is a continuation of prior International Application No. PCT/JP2009/004957 filed on Sep. 29, 2009; the entire contents of all of which are incorporated herein by reference.

FIELD

Embodiments described herein relate to a receiving apparatus receiving a radio signal.

BACKGROUND

Technical developments of receiving apparatuses are in progress, which allow activation of an electronic apparatus such as a TV, an air conditioner, or a laptop PC (personal computer) by a radio signal, and consume low power during standby for a radio signal.

Here, if an interference wave from another apparatus (for example, a terminal of a wireless LAN or an AP (access point)) exists when a radio signal (desired wave) is received, there is a concern that reception accuracy of the desired wave decreases, and the reception error increases. To reduce the influence by this interference wave, it is conceivable to perform AGC (Automatic Gain Control) in the receiving apparatus, so as to prevent reception of the interference wave. In addition, a technique to control a gain using a comparator has been disclosed (see Patent Document 1).

However, when the interference wave exists just before the desired wave is received, it is possible that the AGC is started on the interference wave. As a result, the AGC on the desired wave is not performed, and it is possible that a reception error rate worsens. It is an object of the present invention to provide a receiving apparatus in which the influence of an interference wave is reduced during gain control.

DETAILED DESCRIPTION

In one embodiment, a receiving apparatus includes: a rectifier to rectify a received signal to obtain a direct-current signal; a variable gain unit capable of changing a gain between a first gain and a second gain smaller than the first gain, and to amplify a received signal with a gain to obtain an amplified signal; a comparator to compare a power of the amplified signal with a reference value and to generate a comparison result; and a controller to set a gain to the first gain while being in a standby state, and to reset a gain to a third gain between the first gain and the second gain if the received signal having the power larger than the reference value is received while being in a standby state. After a gain is set to the third gain, the controller sets a gain to the first gain if the power is equal to or lower than the reference value, and after a gain is set to the first gain, the controller turns to the standby state if the power is equal to or lower than the reference value or sets a gain to a fourth gain between the first gain and the third gain and the fourth gain enables reception of the received signal, if the power is larger than the reference value.

Hereinafter, the present embodiments will be described in detail with reference to the drawings.

First Embodiment

Figure 1:
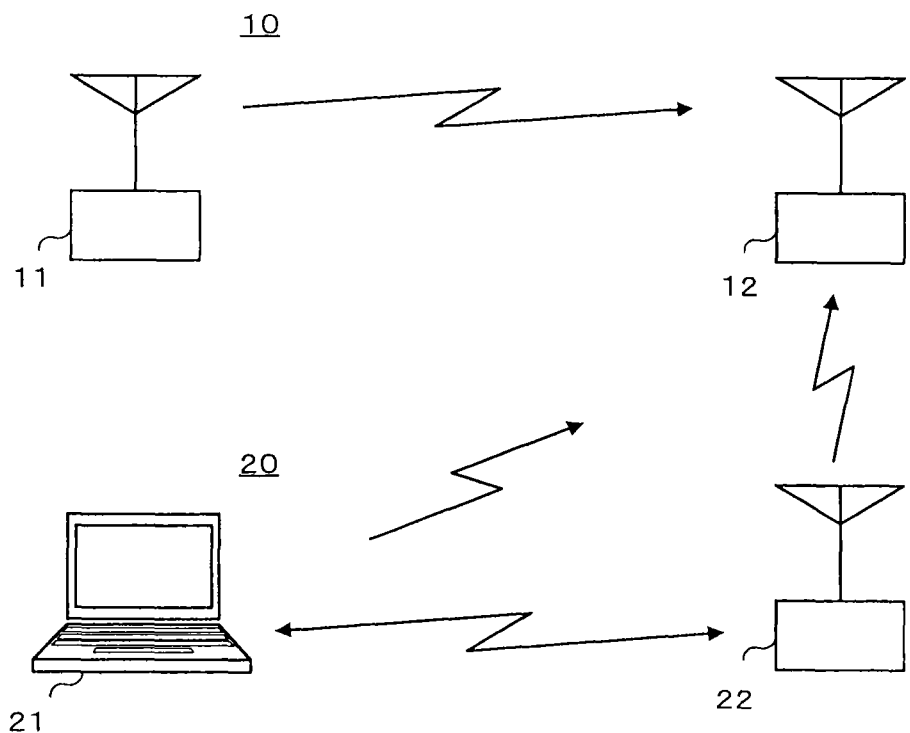
FIG. 1 is a block diagram schematically illustrating a radio communication system according to a first embodiment.

FIG. 1 schematically illustrates a radio communication system 10 according to a first embodiment. The radio communication system 10 includes radio communication apparatuses 11, 12. The radio communication apparatus 11 transmits a signal to the radio communication apparatus 12. The radio communication apparatus 11 transmits a radio signal to the radio communication apparatus 12 in, for example, the 2.4 GHz band using a first communication method.

As the first communication method, a modulation method such as ASK (Amplitude Shift Keying) or PPM (Pulse Position Modulation) can be used. In these modulation methods, the amplitude of a signal is changed over time, and thus the radio signal contains amplitude information. Accordingly, it is possible to activate the radio communication apparatus 12 by extracting the amplitude information by a rectifier 104, which will be described later. Consequently, power consumption of the radio communication apparatus 12 during standby for a radio signal can be decreased.

Here, the case where a radio communication system 20 different from the radio communication system 10 exists is assumed. The second radio communication system transmits/receives a radio signal using a second communication method in the same frequency band (for example, the 2.4 GHz band) as that of the radio communication system 10.

As the second communication method, for example, a communication method complying with the IEEE 802.11b/g/n standard is conceivable.

Here, the radio communication system 20 is a wireless LAN system having a wireless LAN terminal (STA (Station)) 21 and a wireless LAN base station (AP (Access Point)) 22, and transmitting/receiving a wireless LAN frame signal.

Here, the radio signal transmitted by the radio communication apparatus 11 can be received by at least the radio communication apparatus 12. Further, a radio signal transmitted by the STA 21 or AP 22 can be received by at least the radio communication apparatus 12 and the apparatus of the STA 21 or AP 22.

When complying with the IEEE 802.11 standard, the STA 21 and the AP 22 uses CSMA/CA (carrier sense multiple access with collision avoidance network) as an access method. Accordingly, when the STA 21 and the AP 22 recognize a radio signal before transmission, they do not perform transmission until this radio signal is no longer recognized. However, it is possible that the STA 21 and the AP 22 do not recognize a radio signal and start transmission at a timing just before the radio communication apparatus 11 starts transmission.

Therefore, when the radio communication apparatus 11 transmits a radio signal (desired wave) after a radio signal (interference wave) is transmitted from the STA 21, the radio communication apparatus 12 detects an edge by the interference wave (false detection of edge (false detection of desired wave)) and controls a gain (AGC). As a result, it becomes difficult to accurately demodulate the radio communication signal (desired wave) transmitted by the radio communication apparatus 11, which is received immediately thereafter.

Accordingly, in this embodiment, as will be described later, when the radio communication apparatus 12 detects an edge (radio signal), reception sensitivity is increased to confirm the presence of a radio signal in a middle stage of gain control. As a result, the desired wave, which is received just after the interference wave, is demodulated accurately.

(Radio Communication Apparatus 12)

Figure 2:
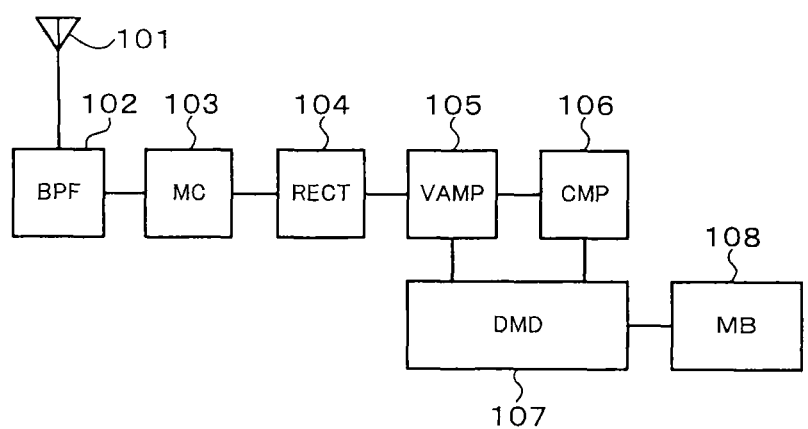
FIG. 2 is a block diagram representing an example of the structure of a radio communication apparatus 12.

The radio communication apparatus 12 will be described using FIG. 2. The radio communication apparatus 12 receives and demodulates a modulated signal of the first communication method. The radio communication apparatus 12 has: a rectifier rectifying a received signal to obtain a direct-current signal; a variable gain unit capable of changing a gain between a first gain and a second gain smaller than the first gain, and amplifying the received signal with the gain to obtain an amplified signal; a comparator comparing the power of the amplified signal with a reference value and generating a comparison result; and a controller setting the gain.

The controller sets the gain of the variable gain unit to a third gain between the first gain and the second gain when the received signal having the power larger than the reference value is received while being in a standby state. After the gain is set to the third gain, the controller sets the gain to the first gain when the power is equal to or lower than the reference value. After the gain is set to the first gain, the controller turns to the standby state when the power is equal to or lower than the reference value or sets the gain to a fourth gain, which is between the first gain and the third gain and is smallest among gains which enable reception of the received signal, when the power is larger than the reference value.

Specifically, the radio communication apparatus 12 has an antenna 101, a band-pass filter (BPF) 102, a matching circuit (MC) 203, a rectifier (RECT) 104, a variable amplifier (VAMP) 105 corresponding to the variable gain unit, a comparator (CMP) 106, a demodulator (DMD) 107 corresponding to the controller, and an apparatus main body (MB) 108.

The antenna 101 converts an electromagnetic wave inputted from the outside of the radio communication apparatus 12 and outputs it to the band-pass filter 102.

The band-pass filter 102 is an RF filter for limiting a band. The band-pass filter 102 outputs to the matching circuit 103 at least frequency components in the band (for example, 2.4 GHz band) of the radio communication system 10 in the received signal inputted from the antenna 101, and attenuates other frequency components.

The matching circuit 103 performs matching of the electrical signal in the 2.4 GHz band inputted from the band-pass filter 102 and outputs a matched signal to the rectifier 104.

The rectifier 104 rectifies a received signal in the 2.4 GHz band inputted from the matching circuit 103 and converts it into a BB (baseband) analog signal (direct-current signal), and outputs this signal to the variable amplifier 105.

The variable amplifier 105 amplifies the power of the BB analog signal inputted from the rectifier 104 to generate an amplified signal, and outputs the amplified signal to the comparator 106. The variable amplifier 105 changes the gain between the first gain and the second gain smaller than the first gain according to a control signal from the demodulator 107.

The comparator 106 receives the BB analog signal from the variable amplifier 105 and compares the power (more precisely, voltage) of the received BB analog signal with a threshold power (more precisely, a reference voltage Vref) which is set in advance. A result thereof is converted into a binary digital signal (H or L) and outputted to the demodulator 107 as a power comparison result. When the power of the BB analog signal is larger than the threshold power, a high signal is outputted to the demodulator 107. On the other hand, when the power of the BB analog signal is smaller than the threshold power, a low signal is outputted to the demodulator 107.

The demodulator 107 receives a digital signal from the comparator 106, demodulates this signal, and controls activation or the like of the apparatus main body 108 based on a result of the demodulation. The demodulator 107 outputs a control signal to the variable amplifier 105 when a condition which will be described later is satisfied, so as to control the gain.

The apparatus main body 108 is an electronic apparatus such as a TV, an air conditioner, or a laptop PC (personal computer).

(Details of the Rectifier 104)

Figure 3:
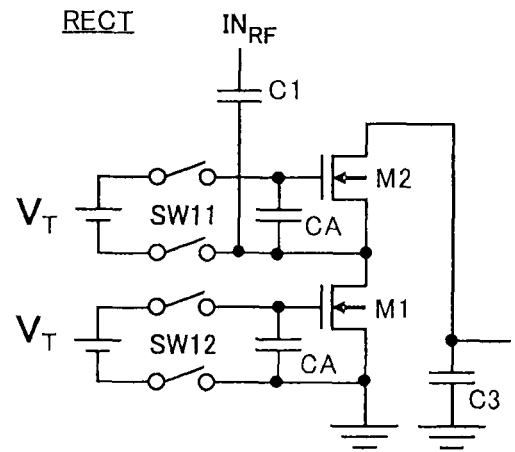
FIG. 3 is a circuit diagram representing an example of the structure of a rectifier 104.

FIG. 3 is a circuit diagram representing an example of the internal structure of the rectifier 104. In this diagram, the rectifier 104 has transistors (FET: Field Effect Transistor) M1, M2, capacitors C1, CA, C3, switches SW11, SW12, and voltage sources VT. The capacitors CA are connected between respective gates and sources of the transistors M1, M2. The voltages VT are connected to the capacitors CA via switches SW11, SW12.

The switches SW11, SW12 are controlled by the demodulator 107. When a signal is not received, the switches SW11, SW12 are closed while a signal is not received, and the voltages VT are applied to the capacitors CA to thereby charge the capacitors CA. When a signal is received, the switches SW11, SW12 are opened and the voltages of the capacitors CA are applied between the respective gates and sources of the transistors M1, M2.

The capacitor C1 is connected between an RF input terminal $IN_{RF}$ and the source of the transistor M2. The RF input terminal $IN_{RF}$ is connected to the matching circuit 103. The RF signal (received signal) is inputted from the RF input terminal $IN_{RF}$ to the transistor M2 via the capacitor C1. The capacitor C3 accumulates electric charges outputted from the transistor M2.

The transistors M1, M2 rectify the received signal (operates as a diode). When magnitudes of thresholds of the transistors M1, M2 become large, a loss during rectification by the transistors M1, M2 becomes large. By making the thresholds apparently small, the loss can be decreased. When the capacitors CA are charged with electric charges to generate a voltage by the amount of threshold voltages, the threshold voltage is cancelled to thereby reduce the loss (improvement in gain).

Here, by making the voltage of the voltage sources VT variable, it is possible to control the gain of the rectifier 104. That is, instead of the variable amplifier 105 or together with the variable amplifier 105, it is possible to change the gain by the rectifier 104. In this case, the rectifier 104 receives a control signal from the demodulator 107 and changes the gain by changing the voltage of the voltage sources VT according to this control signal.

(Details of the Demodulator 107)

Figure 4:
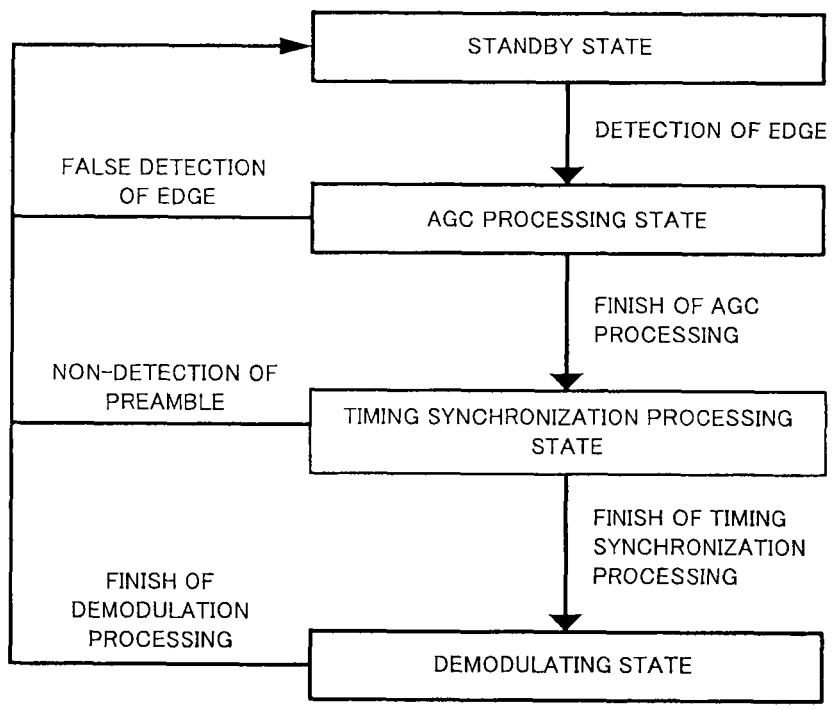
FIG. 4 is a flowchart representing a state transition of a demodulator 107.

A state transition of the demodulator 107 will be described using FIG. 4. The demodulator 107 transits through a standby state, an AGC processing state, a timing synchronization processing state, and a demodulating state, and performs different processing according to each state. When a certain condition is met in each state, the demodulator transits to a different state.

The standby state is a state of waiting for a desired wave to come. When the demodulator 107 detects an edge (detection of desired wave), the demodulator transits from the standby state to the AGC processing state. For example, when the input of the comparator 106 is a high signal once or plural times consecutively, it is judged that an edge is detected.

In the AGC processing state, AGC processing is carried out. That is, as will be described later, the gain of the variable amplifier 105 is adjusted so that a threshold of the comparator 106 becomes a value between the power of the desired wave and the power of the interference wave. That is, it is adjusted to the smallest gain among gains which enable reception of the desired wave. By making the power of the interference wave smaller than the threshold of the comparator 106, the influence of the interference wave can be reduced. However, here it is assumed that the power of the interference wave is small as compared to the power of the desired wave.

When the AGC processing is completed, the demodulator transits to the timing synchronization processing state. However, when false detection of edge is judged in middle of the AGC processing, the demodulator transits from the AGC processing state to the standby state. The false detection of edge will be described later.

In the timing synchronization processing state, a preamble is detected to perform timing synchronization processing. When the timing synchronization processing is finished, the demodulator transits to the demodulating state. However, when no preamble is detected, the demodulator transits from the timing synchronization processing state to the standby state.

In the demodulating state, demodulation processing is performed. Processing is performed according to a demodulation result, and when the demodulation processing is finished, the demodulator transits to the standby state.

(Details of the AGC Processing State)

Details of the AGC processing state will be described below. In the AGC processing state, a desired wave level is controlled to be an appropriate level. That is, the gain of the variable amplifier 105 (and the rectifier 104 depending on the situation) is controlled so as to avoid that an interference wave having a sufficiently smaller power than the desired wave does not surpass the threshold of the comparator 106. The target gain of the AGC is a gain such that the power of the desired wave surpasses the threshold of the comparator 106 and the power of the interference wave is lower than the threshold of the comparator 106 as much as possible.

Figure 5:
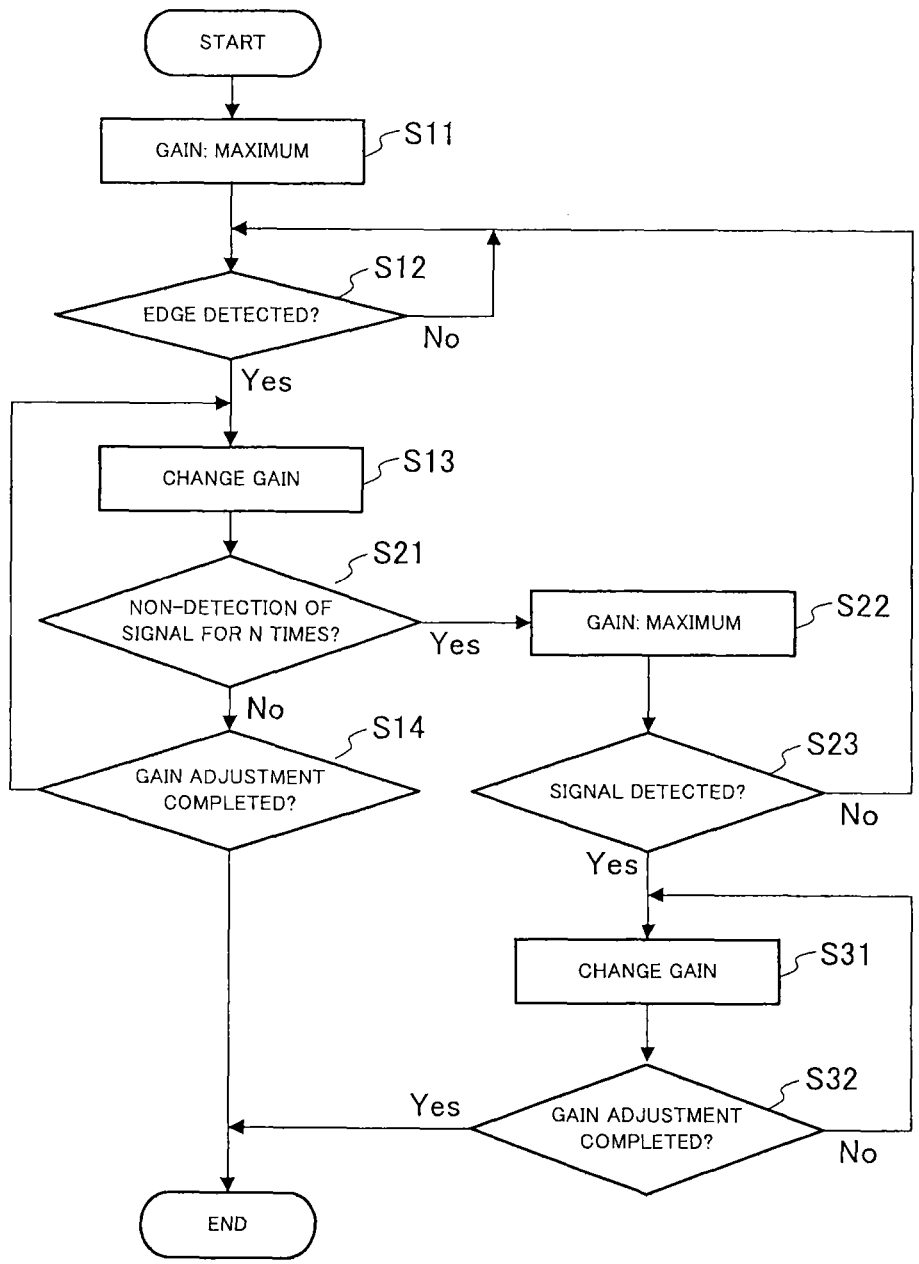
FIG. 5 is a flowchart representing the contents of processing in a standby state and an AGC processing state.

Operation of the AGC will be described. FIG. 5 is a flowchart representing the contents of processing in the standby.

(1) Standby State (Steps S11, S12)

Prior to the AGC processing state (standby state), the gain is set to maximum (0 dB) in a dynamic range (maximum reception sensitivity, that is, receivable signal strength is minimum. First gain). Upon detection of an edge, the demodulator transits to the AGC processing state (step S13).

(2) Adjusting the Gain (steps S13, S14)

The gain is changed stepwise as follows in the AGC processing state (step S13). The dynamic range is divided into, for example, $2^n$ sections (n: integer) (($2^n$+1) as a number of boundaries), and the gain is controlled by the resolution corresponding to the sections. For example, the dynamic range of 48 dB (0 to −48 dB) is divided into eight, and the gain is controlled by the resolution of 6 dB. When the dynamic range is divided into $2^n$ sections, determination of the gain by a dichotomizing search becomes easy.

The gain is adjusted using a preamble for AGC contained in a signal. The preamble for AGC is formed of a high signal.

Among input signals from the comparator 106, for example, an amount of data of five clocks is taken in for adjusting the gain of the variable amplifier 105. For example, when there are four or more high signals (detection of high signal), the gain of the variable amplifier 105 is decreased. On the other hand, when there are less than four high signals (there are two or more low signals) (non-detection of high signal), the gain of the variable amplifier 105 is increased. Thus, a search is performed for the limit of the gain with which the input signal from the comparator 106 is considered as a high signal in the range of resolutions (step S14).

Basically, the dynamic range is sequentially divided in two, and it is determined which of them the gain is set to (dichotomizing search). In the dichotomizing search, the gain for the first time (initial value of the gain, third gain) is set to, for example, the center (here, −24 dB) of the dynamic range. Then, for the second time and the third time, the gain is set to respective previous gains ±12 dB and ±6 dB depending on the presence/absence of detection of high signal. Finally, the gain of the variable amplifier 105 is set to a minimum gain (fifth gain) which enables detection of high signal (step S14). The fifth gain is a value between the first gain and the second gain.

(3) Reconfirming the Desired Signal (Steps S21 to S23)

In this embodiment, if the high signal is not detected even when the gain is changed (step S21), the adjustment of the gain is stopped once, and the presence of the desired signal is reconfirmed (steps S22, S23).

First, it is judged whether or not non-detection of high signal occurs sequentially as a result of gain setting for the first to N-th times (step S21). N can be an appropriate number of 1 or larger. When N=1, it means that the high signal is not detected as a result of gain setting for the first time. Thus, the demodulator 107 also operates as a counting unit counting the number of times the non-detection of high signal occurs. When this judgment is "yes", the gain is set again to the maximum (first gain), and it is judged whether the high signal is detected or not (steps S22, S23).

(4) Transition to the Standby State (Steps S23, S12)

When the judgment in step S23 is "no", it is assumed as false detection of edge, and the demodulator transits to the standby state (step S12).

(5) Adjusting the Gain (Steps S31, S32)

When the judgment in step S23 is "yes", the gain is adjusted to continue from gain control of the N-th time, by the dichotomizing search similarly to steps S13, S14. That is, the gain of the variable amplifier 105 is set to the minimum gain (fourth gain) which enables detection of high signal. The fourth gain is a value between the first gain and the third gain.

Figure 6:
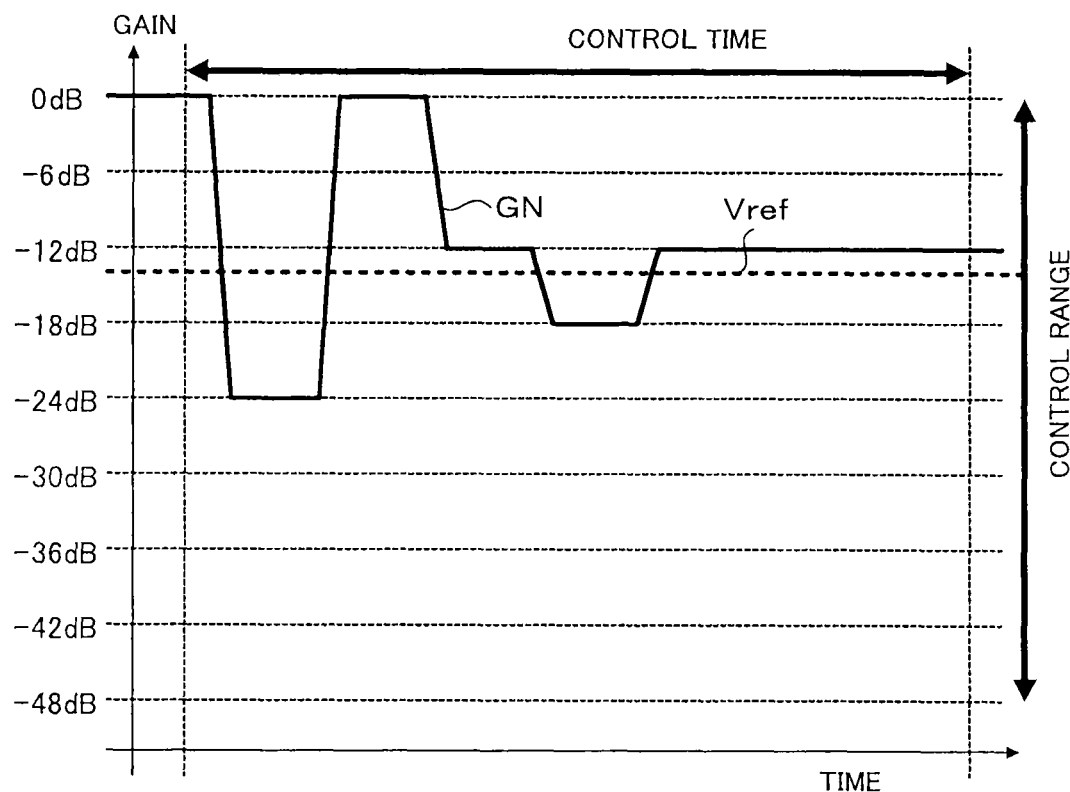
FIG. 6 is a graph representing an example of a change of the gain over time.

FIG. 6 is a graph representing an example of a change of the gain over time. As an example, a gain transition until the gain is set to −12 dB by the AGC is illustrated. After an edge is detected at 0 dB which is the minimum reception sensitivity, the AGC processing is started. The presence/absence of detection of high signal is confirmed with the gain of −24 dB, 0 dB, −12 dB, −18 dB, −12 dB. In other words, it is confirmed that the threshold of the comparator 106 is surpassed, that is, the high signal appears four times or more in the amount of data of five clocks.

Here, since the high signal is not detected by gain control for the first time (−24 dB), the gain is set to the maximum (0 dB) in gain control for the second time. That is, this diagram corresponds to the case where N=1 in the flowchart of FIG. 4. In this example, the high signal is detected by setting the gain to the maximum (0 dB), and the dichotomizing search is resumed.

The dichotomizing search is resumed to continue from gain control for the first time. That is, the demodulator 107 sets the gain of the variable amplifier 105 between the first gain and the third gain. Since the high signal is not detected by gain control for the first time, it is set to (−12 dB) by gain control for the third time. Thereafter, as a result of the dichotomizing search, the gain is controlled to −18 dB, −12 dB. It is confirmed that the high signal is not detected with the gain −18 dB, and the gain is finally controlled to −12 dB. Thereafter, it is confirmed that the high signal is detected with the gain −12 dB (the high signal appears four times or more in the amount of data of five clocks), and the gain is locked and the AGC processing is finished.

Here, the presence/absence of the AGC preamble is judged by setting the gain to the maximum, 0 dB, in gain control for the second time. That is, when an edge is falsely detected, the false detection of edge can be judged in gain control for the second time. The radio communication apparatus 12 stops the AGC processing thereafter, and can transits to the standby state while keeping the minimum reception sensitivity. That is, it becomes possible to receive and demodulate a radio signal transmitted by the radio communication apparatus 11, which is received just after the false detection.

(A Frame Format Transmitted by the Radio Communication Apparatus 11)

Figure 7:
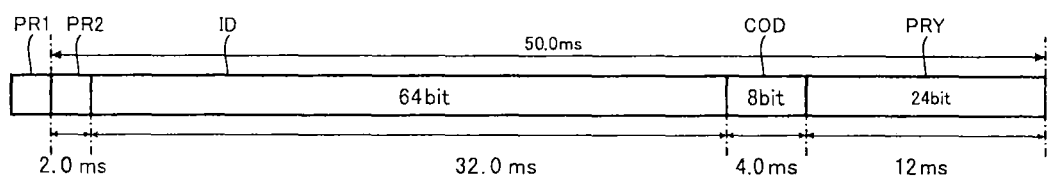
FIG. 7 is a diagram illustrating an example of a frame format.

FIG. 7 illustrates a frame format transmitted by the radio communication apparatus 11. The frame format includes a preamble PR1 for AGC, a preamble PR2 for timing synchronization, an ID bit ID, an instruction bit COD, and a parity bit PRY, and is a signal of an ASK modulation method for example.

The AGC preamble PR1 is entirely formed of a high signal. The preamble PR2 for timing synchronization is formed of a unique word which does not exist in the field of the ID bit or the instruction bit.

The radio communication apparatus 12 performs edge detection and AGC processing as described above with the received preamble for AGC.

(Description of Effects)

Figure 8:
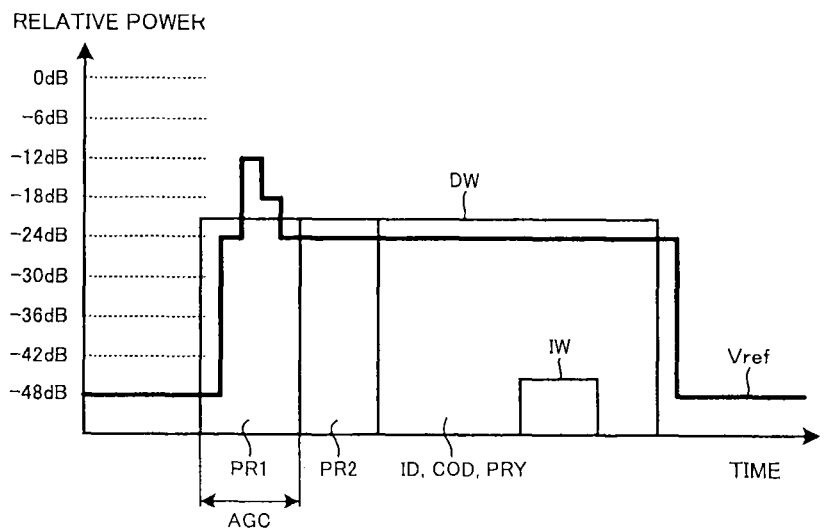
FIG. 8 is a graph representing an example of changes over time of the power of a signal and a threshold of a comparator 106 during an ordinary AGC processing.
Figure 9:
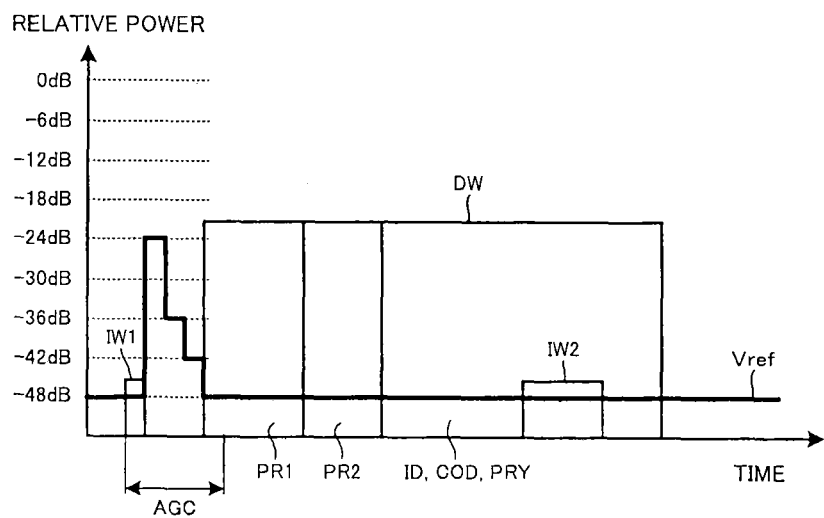
FIG. 9 is a graph representing another example of changes over time of the power of a signal and the threshold of the comparator 106 during the ordinary AGC processing.

FIG. 8 and FIG. 9 are graphs representing changes over time of the power of a signal and the threshold of the comparator 106 during ordinary AGC processing. Unlike FIG. 6, these graphs represent the threshold of the comparator 106 with reference to the power of a previous signal amplified by the variable amplifier 105. Consequently, the influence of a change of gain does not appear in the power of the signal in these graphs. On the other hand, the influence of a change of gain appears apparently in the threshold of the comparator 106. Here, it is assumed that relative power −48 dB to 0 dB corresponds to the gain 0 dB to −48 dB in FIG. 4. That is, the relative power −48 dB in these graphs corresponds to the maximum gain 0 dB in FIG. 6.

In FIG. 8, just before start of transmission of a desired wave DW from the radio communication apparatus 11, an interference wave IW is not transmitted from the radio communication system 20. Accordingly, the AGC processing succeeds, and the gain can be controlled to the desired gain with the preamble PR1 for AGC. That is, even when the interference wave IW sufficiently smaller than the desired wave DW exists in the preamble PR2 for timing synchronization, the ID bit ID, the instruction bit COD, and the parity bit PRY, there is no influence of the interference wave, and demodulation is possible.

In FIG. 9, just before start of transmission of the desired wave DW from the radio communication apparatus 11, an interference wave IW1 is transmitted from the radio communication system 20. Accordingly, the AGC processing fails. The transmission signal (interference wave) from the radio communication system 20 causes false judgment of edge detection, and the AGC processing is started. Thereafter, when the radio signal transmitted by the radio communication apparatus 11 is received in middle of the AGC processing, an error occurs in gain setting by the dichotomizing search. In this example, as a result of the AGC processing, the gain is set to 0 dB (relative power −48 dB). As a consequence, the interference wave IW2 influences the output from the comparator 106, and it becomes difficult to accurately demodulate the desired wave from the radio communication apparatus 11.

The AGC processing in this embodiment will be described next. It is assumed that, as illustrated in FIG. 8, the interference wave IW is transmitted from the radio communication system 20 after start of transmission of the desired wave DW from the radio communication apparatus 11. In this case, the judgment in step S21 of FIG. 5 is "no", and a variation status of the gain is similar to that in the ordinary AGC. The AGC processing succeeds and the gain can be controlled to the desired gain with the preamble PR1 for AGC.

Figure 10:
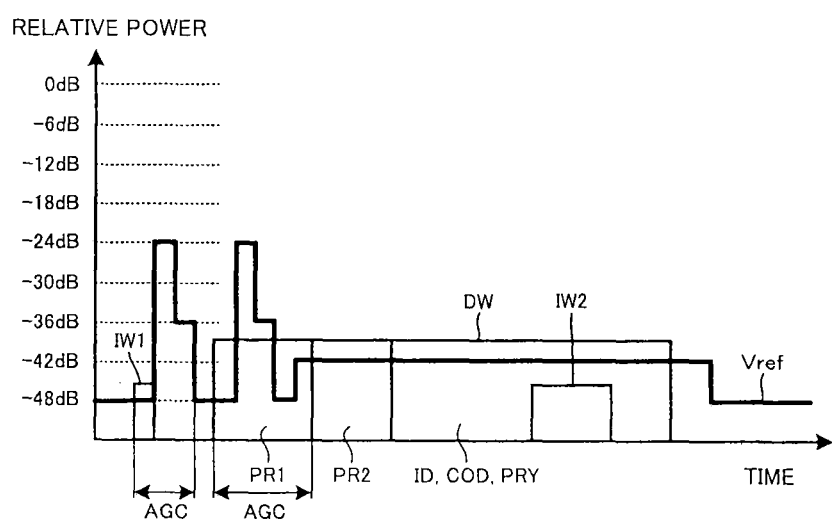
FIG. 10 is a graph representing another example of changes over time of the power of a signal and the threshold of the comparator 106 during AGC processing of this embodiment.

FIG. 10 is a graph representing changes over time of the power of a signal and the threshold of the comparator 106 during AGC processing of this embodiment corresponding to FIG. 9.

In FIG. 10, just before start of transmission of the desired wave DW from the radio communication apparatus 11, the interference wave IW1 is transmitted from the radio communication system 20. Unlike FIG. 9, the AGC processing succeeds. Similarly to FIG. 9, the transmission signal (interference wave) from the radio communication system 20 causes false judgment of edge detection, and the AGC processing is started.

However, the judgment in step S21 of FIG. 5 is "yes", and the gain is set to the maximum in middle of the AGC processing. In this example, the high signal is not detected for two times of gains −24 dB, −12 dB (−24 dB, −36 dB by the threshold in relative power), and this causes the gain to be set to the maximum, 0 dB. The non-detection of high signal causes a transition to the standby state. That is, this example corresponds to the case where N=2 in step 21 of FIG. 5.

By receiving the radio signal transmitted by the radio communication apparatus 11 in the standby state, the AGC processing is performed at the timing of the AGC preamble PR1. As a result, even when the interference wave is transmitted just before start of transmission of the desired wave DW, it is not influenced by the interference wave, and the desired wave can be demodulated accurately.

In the foregoing, an edge is detected using the AGO preamble PR1. In this point, it is possible to use a preamble PR0 for edge detection besides the AGC preamble PR1.

Figure 11:
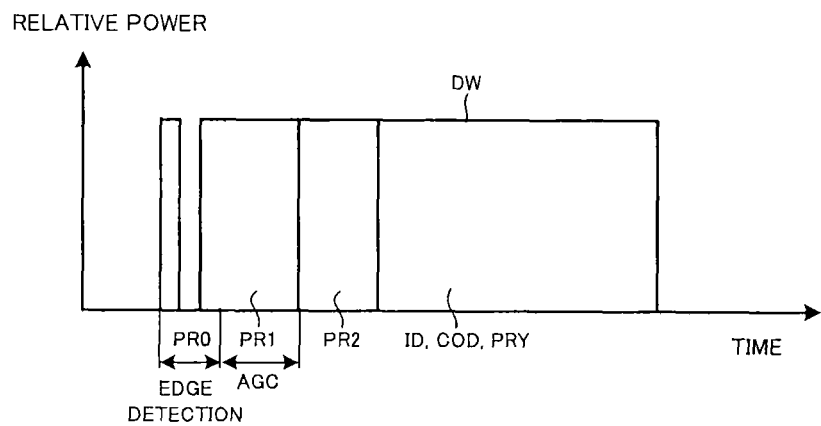
FIG. 11 is a graph representing an example of a frame format including a preamble PR0 for edge detection.

FIG. 11 is a graph representing an example of a frame format including the preamble PR0 for edge detection. The preamble PR0 for edge detection is disposed prior to the AGC preamble PR1. The preamble PR0 for edge detection in this example is formed of "HLH", that is, a combination of two high signals and one low signal. The preamble PR0 for edge detection may employ one of various patterns, such as "HLHLH" and "HHLH" other than the "HLH".

Thus, by using the preamble PR0 for edge detection, and by the radio communication apparatus 12 confirming the pattern of the preamble PR0 for edge detection, it is possible to prevent false detection of edge.

As described above, in the radio communication system 10, the step of setting the gain to maximum in the AGC processing of the radio communication apparatus 12 is incorporated. Consequently, even when the interference wave (wireless LAN frame signal transmitted by the radio system 20) is transmitted just before transmission of the desired wave (just before the radio communication apparatus 11 transmits the radio signal), it becomes possible for the radio communication apparatus 12 to receive and normally demodulate the desired wave.

Second Embodiment

Discriminating a desired wave and an interference wave in the period of performing AGC processing reduces the probability of failure of the AGC processing in the case where the desired wave occurs after a predetermined time from occurrence of the interference wave.

Here, to reduce the probability of failure of the AGC processing, an AGC processing time may be shortened. By using this technique in combination, it is possible to further reduce the probability of failure of the AGC processing. The description below will be given focusing on an approach for reducing the AGC processing time.

Figure 12:
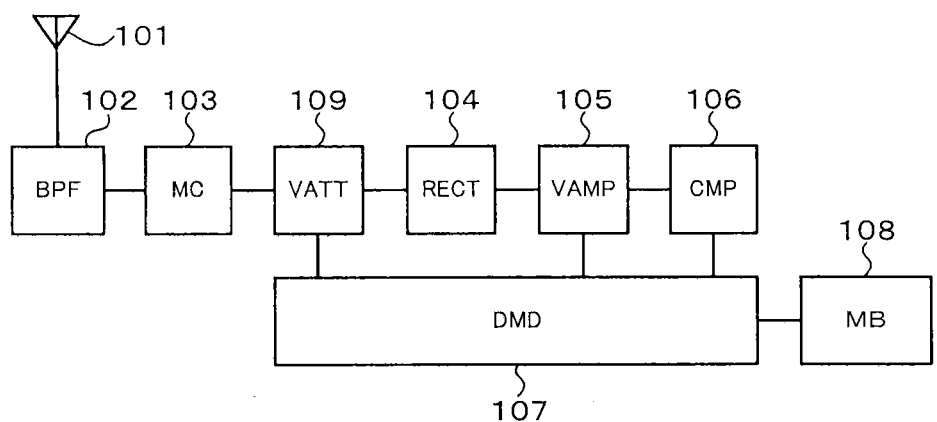
FIG. 12 is a block diagram representing the internal structure of a radio communication apparatus 32 according to a second embodiment.

FIG. 12 represents the internal structure of a radio communication apparatus 32 of a radio communication system 30 according to a second embodiment. The overall structure of the radio communication system 30 is substantially similar to the radio communication system 10 of FIG. 1, and thus the description thereof is omitted.

The radio communication apparatus 32 has an antenna 101, a band-pass filter (BPF) 102, a matching circuit (MC) 103, a variable attenuator (VATT) 109, a rectifier (RECT) 104, a variable amplifier (VAMP) 105, a comparator (CMP) 106, a demodulator (DMD) 107, and an apparatus main body (MB) 108.

In the radio communication apparatus 32, the variable attenuator 109 is added to the radio communication apparatus 12. That is, a signal which passed the band-pass filter 102 is inputted to the rectifier 104 via the matching circuit 103 and via the variable attenuator 109 operating at a high frequency.

Here, the variable attenuator 109 and the variable amplifier 105 are used to adjust the gain of the radio communication apparatus 32. As already described, the rectifier 104 can also be used for changing the gain.

Further, the variable attenuator 109 and the variable amplifier 105 do not change the gain sequentially but switch the gain digitally. In the variable attenuator 109 and the variable amplifier 105, the gain is controlled by control signals VCNT1, VCNT2, respectively, having a predetermined bit row with a step width of S [dB] from the demodulator 107.

Further, the gain (first to fourth gain) described in the first embodiment is of an amount of adding an attenuation amount of the variable attenuator 109 and an amplification amount of the variable amplifier 105. That is, since the gain of the variable amplifier 105 described in the first embodiment is determined by an amplified signal with respect to a received signal, the gain of the first embodiment corresponds to one in which both the attenuation amount of the variable attenuator 109 and the amplification amount of the variable amplifier 105 are added in this embodiment. By adjusting both the attenuation amount of the variable attenuator 109 and the amplification amount of the variable amplifier 105, the demodulator 107 sets the gain (first to fourth gain) similarly to the first embodiment.

To achieve the desired gain (first to fourth gain), the demodulator 107 may adjust only one of the attenuation amount of the variable attenuator 109 and the amplification amount of the variable amplifier 105. The demodulator 107 may adjust the attenuation amount of the variable attenuator 109 first, and then adjust the amplification amount of the variable amplifier 105. Further, by preparing a table or a function indicating the relation of the gain with the attenuation amount of the variable attenuator 109 and the amplification amount of the variable amplifier 105 in advance, the demodulator 107 may adjust the attenuation amount of the variable attenuator 109 and the amplification amount of the variable amplifier 105 according to these table and function.

Figure 13:
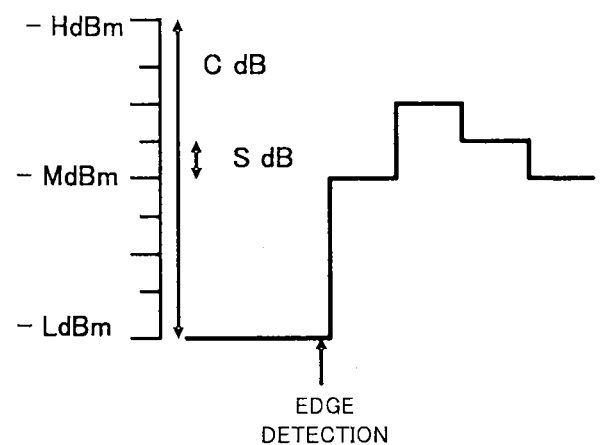
FIG. 13 is a diagram illustrating an example of AGC control by a dichotomizing search.

FIG. 13 is a diagram illustrating an example of AGC control by the dichotomizing search (binary search). Powers −L (dBm) and −H (dBm) represent the maximum power and the minimum power, respectively, which can be received. That is, the powers −L (dBm) and −H (dBm) correspond to the maximum and minimum gain, respectively. The power −M (dBm) is a central power between a maximum power and a sensitivity power which are denoted by dB, where M=(L+H)/2. A reception dynamic range C=L−H [dB].

The case where the power of an inputted signal is −M (dBm) or higher and −M+S (dBm) or lower is considered. After detection of an edge, a change of the gain and judgment of H/L by the comparator 106 are repeated. In this example, the power as changed sequentially as −M (dBm), −M+2S (dBm), −M+S (dBm), −M (dBm). That is, in this example, the gain is changed four times since the edge is detected.

In this manner, in the dichotomizing search, when areas to be judged are W=$2^{(w+q)}$ (q=0 or 1, w is integer), (w+1) steps are necessary.

Modification Example 1

Figure 14:
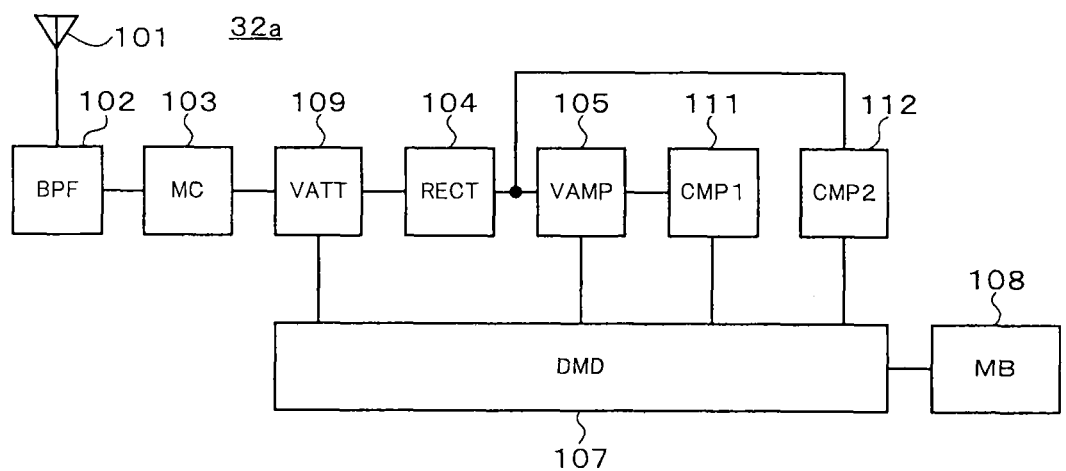
FIG. 14 is a block diagram illustrating the structure of a radio communication apparatus 32a according to modification example 1.

Here, to make an error rate of the gain setting small, the number of steps of gain setting is set equal to or lower than the number of steps necessary for the dichotomizing search. FIG. 14 illustrates the structure of a radio communication apparatus 32a according to modification example 1.

Unlike the radio communication apparatus 32, the radio communication apparatus 32a has two comparators (CMP1, CMP2) 111, 112. The comparators 111, 112 detect outputs of the variable amplifier 105, the rectifier 104, respectively. As compared to a reference voltage Vref1 of the comparator 111, a reference voltage Vref2 of the comparator 112 is $10^{(S/20)}$ times the reference voltage Vref of the comparator 111. $10^{(S/20)}$ times mean S [dB] when converted into dB.

When the maximum gain of the variable amplifier 105 is E [dB], the comparator 112 judges H/L with reference to a value higher by (E+S) [dB] as compared to the comparator 111. Therefore, when the rectifier 104 and so on operate linearly, if the half C/2 [dB] of a variable range of the gain is equal to E+S [dB], the comparator 112 has performed the judgment in the first step of the dichotomizing search.

However, the rectifier 104 has a transmission function of "y=$x^2$", and thus the dynamic range of the rectifier and the following is 2C [dB]. Consequently, by setting 2C/2=C=(E+S) [dB], discrimination in the first step of the dichotomizing search can be performed by the comparator 112. In addition, this setting error needs to be equal to or lower than S [dB] of the minimum range.

It is possible in principle to perform discrimination in the first step of the dichotomizing search by the comparator 112 as follows. Specifically, the reference Vref2 for judgment by the comparator 112 is set to $10^{(C/20)}$ times the reference Vref1 for judgment by the comparator 111, and the comparator 112 is connected to the same terminal as the comparator 111. However, in this case, the output of the variable amplifier 105 is saturated even by an input of −M (dBm) or lower, and thus the comparator 112 is not able to judge.

To avoid this, in this embodiment, the output of the rectifier 104 is inputted to the comparator 112.

Figure 15:
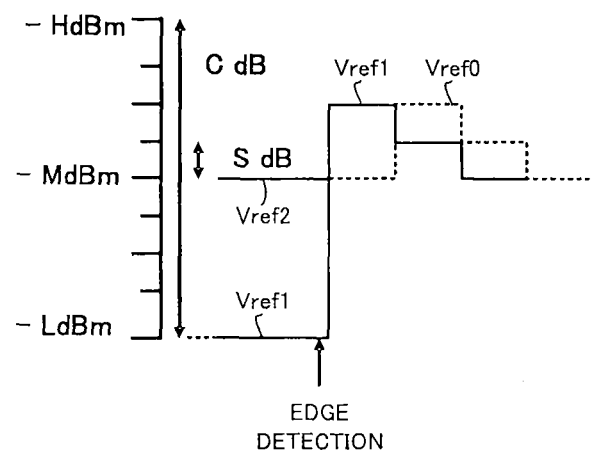
FIG. 15 is a diagram illustrating an example of the AGC control by the dichotomizing search in modification example 1.

FIG. 15 illustrates how the first one step is reduced. Solid lines represent this embodiment and dashed lines represent the conventional example. At the same time as edge detection by the comparator 111, the comparator 112 judges whether the input signal level is higher or smaller than −M (dBm). Accordingly, the number of steps is decreased by one.

Modification Example 2

Figure 16:
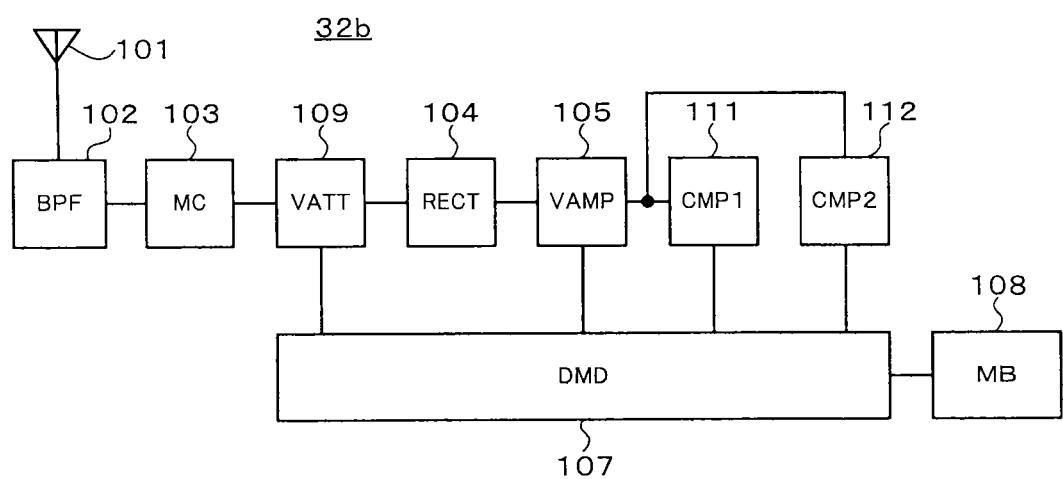
FIG. 16 is a block diagram illustrating the structure of a radio communication apparatus 32h according to modification example 2.

Next, another step reduction method will be described. FIG. 16 illustrates the structure of a radio communication apparatus 32b according to modification example 2. Unlike the radio communication apparatus 32a, in the radio communication apparatus 32b, both the comparators 111, 112 are connected to the variable amplifier 105. The final step of the dichotomizing search judges H/L in adjacent regions relative to the previous step. Using the structure of FIG. 16, the adjacent regions can both be detected in one previous step of the final step. Thus, the final step of the dichotomizing search can be eliminated. The comparators 111, 112 detect the outputs of the variable amplifier 105, the rectifier 104, respectively. As compared to the reference voltage Vref1 of the comparator 111, the reference voltage Vref2 of the comparator 112 is $10^{(C/20)}$ times the reference voltage Vref of the comparator 111.

Figure 17:
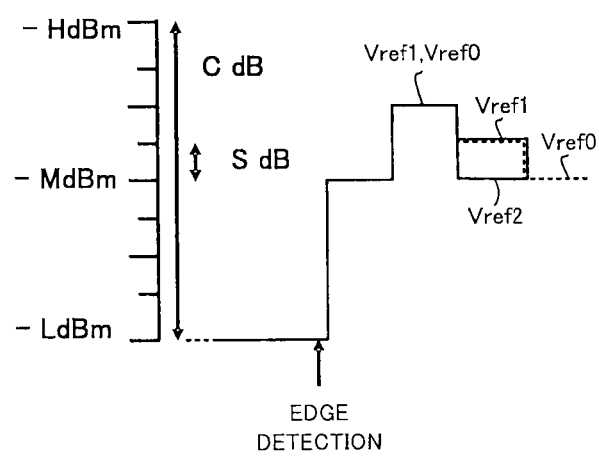
FIG. 17 is a diagram illustrating an example of the AGC control by the dichotomizing search in modification example 1.

FIG. 17 illustrates a judgment procedure of this approach. Solid lines and dashed lines correspond to this embodiment and the conventional example, respectively. The comparator 112 discriminates H/L in adjacent regions together with the comparator 111. By performing discrimination simultaneously with the (Modification Example 3)

As described above, by using the comparators 111, 112, the radio communication apparatuses 32a, 32b eliminate the initial step or the final step of the dichotomizing search. Here, by switching an input destination of the comparator 112, the comparator 112 can be used for both the initial step and the final step.

Figure 18:
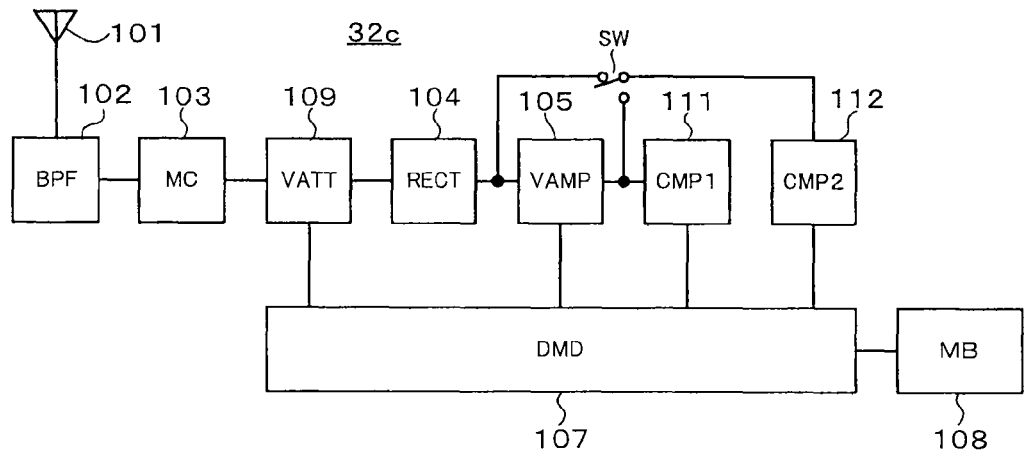
FIG. 18 is a block diagram illustrating the structure of a radio communication apparatus 32c according to modification example 3.

FIG. 18 illustrates the structure of a radio communication apparatus 32c according to modification example 3. Unlike the radio communication apparatuses 32a, 32b, in the radio communication apparatus 32c, a switch SW for switching a path is provided at the input of the comparator 112. The input of the comparator 112 is connected to one of the output of the rectifier 104 and the output of the variable amplifier 105 via the switch SW.

In preparation for judgment in the initial step of gain adjustment, the switch SW normally connects the input of the comparator 112 to the output of the rectifier. Since incoming of a signal can be discriminated by the comparator 111 (edge detection), the input of the comparator 112 is connected to the output of the variable amplifier 105 by controlling the switch SW1 until the final step. Thus, in the final step, the input range is set by both the comparator 111 and the comparator 112. Thus, two steps can be eliminated.

Modification Example 4

Figure 19:
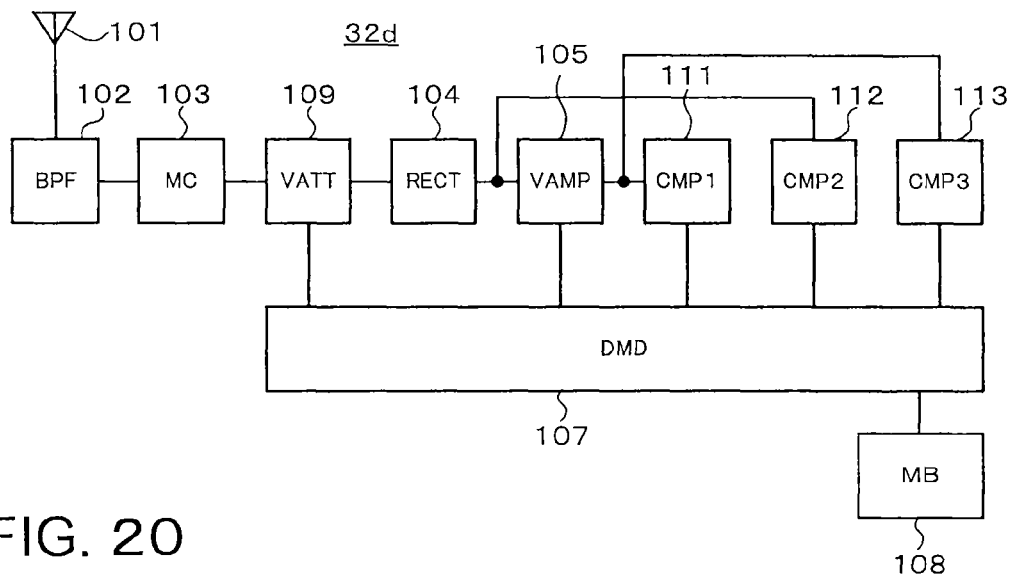
FIG. 19 is a block diagram illustrating the structure of a radio communication apparatus 32d according to modification example 4.

FIG. 19 illustrates the structure of a radio communication apparatus 32d according to modification example 4. Unlike the radio communication apparatus 32c, a comparator (CMP3) 113 is added to the radio communication apparatus 32d. As already described, the comparator 112 is shared in the modification example 3. In this point, in modification example 4, the comparators 112, 113 detect an output of the rectifier 104 and an output of the variable amplifier 105, respectively. Further, the reference for judgment of the comparator 112 and the comparator 113 is $10^{(C/20)}$ times that of the comparator 111.

Figure 20:
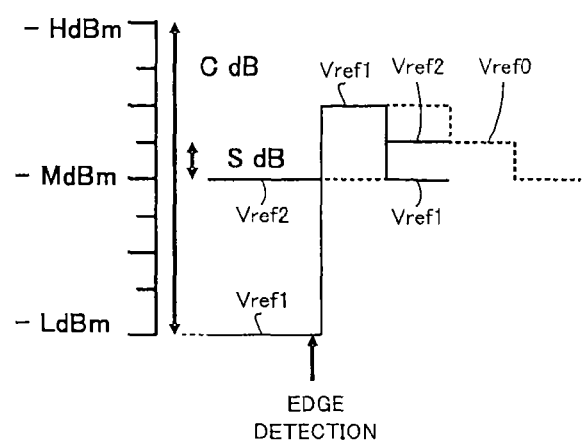
FIG. 20 is a diagram illustrating an example of AGC control by the dichotomizing search in modification examples 3, 4.

FIG. 20 illustrates a gain setting procedure in the radio communication apparatuses 32c, 32d. Solid lines and dashed lines correspond to this embodiment and the conventional example, respectively. As compared to the ordinary dichotomizing search, two steps of the initial step and the final step are reduced.

The radio communication apparatus 32d has comparators 111, 112. When the comparators 111, 112 are operated constantly, the power consumption increases by the amount of power consumption of the comparator 112. Here, the power consumption of the comparator 112 can be reduced as follows. Specifically, the presence/absence of a signal is detected by the comparator 111, and when it is judged that the signal is present, the comparator 112 is operated. Thus, the comparator 112 does not operate constantly, and operates only when a signal comes. In this manner, the power consumption of the comparator 112 can be reduced. In addition, this configuration can also be applied to the radio communication apparatus 32c.

Figure 21:
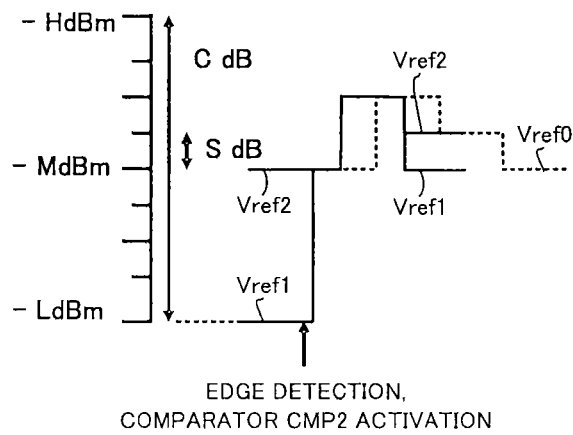
FIG. 21 is a diagram illustrating another example of AGC control by the dichotomizing search in modification examples 3, 4.

FIG. 21 illustrates a gain setting procedure at this time. Solid lines and dashed lines correspond to this embodiment and the conventional example, respectively. As illustrated in this diagram, operation of the comparator 112 is after an edge is detected, and thus the judgment is delayed by this. However, it is not necessary to newly set a gain. Accordingly, as compared to the case where the judgment is performed after setting a gain, the time for the comparator 112 to perform judgment shortens.

Here, it is conceivable to change the reference Vref2 for judgment of the comparator 112. That is, the reference Vref2 for judgment=10 mV*$10^{(n*S/20)}$ is set, and n is changed corresponding to steps.

Figure 22:
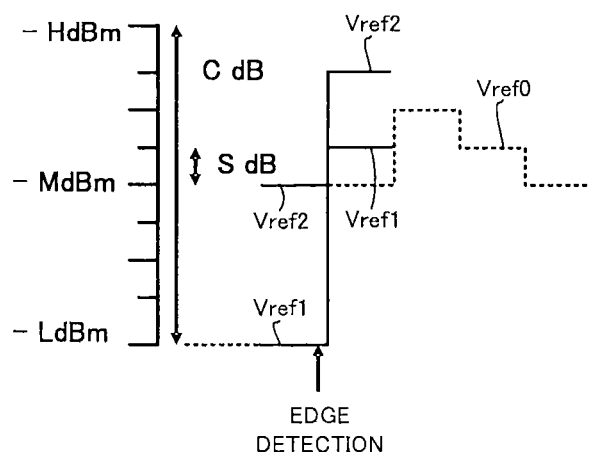
FIG. 22 is a diagram illustrating another example of AGC control by the dichotomizing search in modification examples 3, 4.

FIG. 22 illustrates a gain setting procedure at this time. Solid lines and dashed lines correspond to this embodiment and the conventional example, respectively. When a desired level to be detected is from −M dBm to (−M+S) (dBm) or lower, detection can be done in two steps. In the initial step, the input of the comparator 112 is connected to the output of the rectifier 104, and n=1. In the second step, the input of the comparator 112 is connected to the output of the variable amplifier 105, and n=3. In this case, L is outputted by judgment of the comparator 111, and thus the input range is limited.

As described above, in this embodiment, by detection of the presence/absence of a signal and by reduction of the AGC setting time by adding the comparator, the error probability of AGC setting can be reduced.

In particular, the AGC setting in the case of using the dichotomizing search is described in this embodiment. By performing AGC setting using the above-described dichotomizing search when the fourth gain and the fifth gain of the first embodiment are set, the AGC setting time can be shortened, and the error probability of AGC setting can be reduced.

Here, there may be a case where plural gain changing means with different speeds are used to change the gain. For example, it is conceivable to use the variable attenuator 109 which is relatively high speed and the variable amplifier 105 which is relatively low speed in combination. In this case, it is conceivable to accelerate the gain control totally by using high-speed gain changing means as much as possible.

For example, only the high-speed gain changing means are used in the initial and first half stage of gain control, and the gain is controlled by the low-speed gain changing means in the last half stage of gain control. Specifically, in FIG. 5, the high-speed gain changing means are used for changing the gain in the initial stage of step S13 (the stage smaller than the number N of times in step S21) and S22. In this manner, only the high-speed gain changing means are used in the case of false detection of edge. In the case where it is not false detection of edge, only the high-speed gain changing means are used initially, and the low-speed gain changing means are used in the middle and thereafter.

Other Embodiments

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A receiving apparatus, comprising:
    a rectifier to rectify a received signal to obtain a direct-current signal;
    a variable gain unit capable of changing a gain between a maximum gain and a minimum gain, and to amplify a received signal with the gain to obtain an amplified signal;
    a comparator to compare a power of the amplified signal with a reference value and to generate a comparison result; and
    a controller to set the gain to the maximum gain as a standby state in which the gain is fixed to the maximum gain,
    the controller to set the gain to a first gain between the maximum gain and the minimum gain as an AGC (automatic gain control) state in which the gain is variable if the signal having the power larger than the reference value is received in the standby state,
    the controller to set the gain to the maximum gain as a non-AGC state in which the gain is fixed to the maximum gain if the power is equal to or lower than the reference value and the gain is set to the first gain in the AGC state;
    the controller to turn to the standby state from the non-AGC state if the power is equal to or lower than the reference value and the gain is set to the maximum gain in the non-AGC state; and
    the controller to set the gain to a second gain between the maximum gain and the first gain in the AGC state and the second gain enabling reception of the received signal, if the power is larger than the reference value and the gain is set to the maximum gain in the AGC state.

2. The receiving apparatus according to claim 1, further comprising:

a counting unit to count the number of times the power is sequentially smaller than the reference value if the controller sets the first gain,
wherein the controller turns to the standby state if a counting result in the counting unit is two or larger.

3. The receiving apparatus according to claim 2, wherein the variable gain unit has a variable attenuator to attenuate the received signal and to input an attenuated signal to the rectifier, and a variable amplifier to amplify the direct-current signal to obtain the amplified signal.

4. The receiving apparatus according to claim 3, further comprising:
a second comparator to compare the direct-current signal with a second reference value and to generate a second comparison result,
wherein the controller sets the second gain based on the comparison result and the second comparison result.

5. The receiving apparatus according to claim 4, further comprising:
a third comparator to compare the amplified signal with a third reference value and to generate a third comparison result,
wherein the controller sets the second gain based on the comparison result and the third comparison result.

6. A receiving apparatus, comprising:
a variable attenuator to attenuate a received signal;
a rectifier to rectify a received signal attenuated by the variable attenuator to obtain a direct-current signal;
a variable gain unit to amplify the received signal to obtain an amplified signal;
a comparator to compare a power of the amplified signal with a reference value to generate a comparison result;
a controller to set a total gain, in which an attenuation factor in the variable attenuator and the gain in the variable gain unit are added, to a first gain between a maximum gain and a minimum gain as an AGC (automatic gain control) state in which the gain is variable, if the signal having the power larger than the reference value is received in a standby state in which the gain is fixed to the maximum gain;
the controller to set the total gain to the maximum gain in as a non-AGC state in which the gain is fixed to the maximum gain, if the power is equal to or lower than the reference value and the total gain is set to the first gain in the AGC state;
the controller to turn to the standby state from the non-AGC state, if the power is equal to or lower than the reference value and the total gain is set to the maximum gain in the non-AGC state; and
the controller to set the total gain to a second gain between the maximum gain and the first gain in the AGC state and the second gain enabling reception of the received signal, if the power is larger than the reference value and the total gain is set to the maximum gain in the AGC state.

7. A receiving method, comprising:
rectifying a received signal to obtain a direct-current signal;
changing a gain of a variable gain unit between a maximum gain and a minimum gain, and amplifying the received signal with the gain to obtain an amplified signal;
compare a power of the amplified signal with a reference value and generating a comparison result; and
a controlling setting of the gain of the variable gain unit, including,
setting the gain to the maximum gain as a standby state in which the gain is fixed to the maximum gain,
setting the gain to a first gain between the maximum gain and the minimum gain as an AGC (automatic gain control) state in which the gain is variable if the signal having the power larger than the reference value is received in the standby state,
setting the gain to the maximum gain as a non-AGC state in which the gain is fixed to the maximum gain if the power is equal to or lower than the reference value and the gain is set to the first gain in the AGC state,
turning to the standby state from the non-AGC state if the power is equal to or lower than the reference value and the gain is set to the maximum gain in the non-AGC state, and
setting the gain to a second gain between the maximum gain and the first gain in the AGC state and the second gain enabling reception of the received signal, if the power is larger than the reference value and the gain is set to the maximum gain in the AGC state.

* * * * *